United States Patent [19]
Johannessen

[11] Patent Number: 5,969,439
[45] Date of Patent: Oct. 19, 1999

[54] PULSE GENERATOR APPARATUS FOR RF PULSE GENERATION IN TUNED LOADS INCLUDING SERIES REGULATION AND CAPACITOR CLAMPING METHOD THEREFOR

[75] Inventor: Paul R. Johannessen, Lexington, Mass.

[73] Assignee: Megapulse, Incorporated, Bedford, Mass.

[21] Appl. No.: 09/058,098

[22] Filed: Apr. 9, 1998

[51] Int. Cl.$^6$ .................................................. H03K 3/02
[52] U.S. Cl. ........................... 307/106; 307/108; 327/129
[58] Field of Search .................................. 307/106, 108; 327/129, 465, 379, 380; 343/850; 361/204, 205

[56] References Cited

U.S. PATENT DOCUMENTS

| | | | |
|---|---|---|---|
| 3,577,177 | 5/1971 | Hewlett, Jr. ................................ | 323/235 |
| 3,711,725 | 1/1973 | Johannessen ............................... | 307/108 |
| 3,743,919 | 7/1973 | Bingley ...................................... | 363/160 |
| 3,786,334 | 1/1974 | Johannessen ............................... | 363/71 |
| 3,889,263 | 6/1975 | Johannessen ............................... | 342/388 |
| 4,090,235 | 5/1978 | Mason ........................................ | 363/160 |
| 4,191,992 | 3/1980 | Johannessen ............................... | 363/50 |
| 4,230,955 | 10/1980 | Johannessen ............................. | 327/380 |
| 4,674,022 | 6/1987 | Planck ....................................... | 363/57 |

*Primary Examiner*—Jeffrey Gaffin
*Assistant Examiner*—Kim Huynh
*Attorney, Agent, or Firm*—Rines and Rines

[57] ABSTRACT

An improved pulse generator for RF pulse generation in tuned loads, employing full cycle generators formed by pairs of parallely connected half-cycle SCR-triggered capacitor-charging and discharging generators each having its own separate d.c. power supply, and wherein reverse capacitor voltages are clamped by diode connecting the capacitor of each half-cycle generator to the power supply of the other half-cycle generator.

10 Claims, 5 Drawing Sheets

PULSE GENERATOR APPARATUS FOR RF PULSE GENERATION IN TUNED LOADS INCLUDING SERIES REGULATION AND CAPACITOR CLAMPING METHOD THEREFOR

The present invention relates to pulse generators for generating RF pulses in tuned loads, being more particularly, though not exclusively, concerned with such generation in high Q tuned antennas and in pulse generating systems utilizing the same, such as Loran-C navigation RF pulse transmitters and similar systems, and to the regulation and clamping of SCR-triggered capacitor circuits thereof.

BACKGROUND

In connection with such and related RF pulse transmitters, the art has heretofore made copious use of parallely connected half-cycle generators of the type using switching solid state SCR thyristor switching circuits as described, for example, in U.S. Pat. No. 3,711,725, "Apparatus and Method for Radio-Frequency Pulse Generation in tuned Radio-Frequency Loads"; U.S. Pat. No. 3,786,334, "Magnetic Pulse Compression Radio-Frequency Generator Apparatus"; and U.S. Pat. No. 3,889,263 "Radio Frequency Pulse Generation System and Method", of common assignee with the present invention and exemplarily applied to Loran-C type transmitters and the like.

In such and related half-cycle generation circuits, to minimize SCR losses, priming and sweep-out circuits are employed in series with the main power SCR thyristor to delay the anode current until the full SCR junction area is turned on—such delay preferably being attained by the use of square-loop saturable inductors as described, for example, in U.S. Pat. No. 4,230,955, "Method of and Apparatus for Eliminating Priming and Carrier Sweep-Out Losses in SCR Switching Circuits and The Like", and U.S. Pat. No. 4,674,022, "Improved SCR Priming and Sweep-Out Circuit Apparatus", also of common assignee. Such circuits also require the clamping of reverse voltages on the energy-supplying capacitors to prevent excess voltage across the capacitors, and such clamping circuits have heretofore been provided in successively operated half-cycle generators, by separate clamping power supplies—quite effective, but resulting in losses of substantial output power.

It is to the substantial elimination of such losses through novel substantially lossless capacitor clamping circuits and lossless series regulation of the circuit as well, that the present invention is primarily directed and, while further providing increased immunity from the effects of the false triggering of the SCR switches caused by direct lightning strikes on the antenna and/or by other load-shorting phenomena.

OBJECTS OF INVENTION

The objective of the invention, therefore, is to provide a new and improved pulse generator apparatus and method for RF pulse generation in tuned loads, such as antennas and the like, that are not subject to the above-described and other limitations of prior circuits of this character, but that, to the contrary, provide substantially lossless capacitor clamping and series regulation and improved immunity to false SCR switch triggering as by load shorting.

A further object is to provide such a novel more efficient apparatus particularly useful in Loran-C RF pulse transmitters and the like, wherein it provides also improved invulnerability to the effect of lightning strikes.

Other and further objects will be explained hereinafter and are more particularly delineated in the appended claims.

SUMMARY

In summary, the invention embraces an improved pulse generator for RF pulse generation in tuned loads, employing full cycle generators formed by pairs of parallely connected half-cycle SCR-triggered capacitor-charging and discharging generators each having is own separate d.c. power supply, and wherein reverse capacitor voltages are clamped by a diode connecting the capacitor of each half-cycle generator to the power supply of the other half-cycle generator.

More specifically, from one of its important aspects, the invention embraces pulse generator apparatus for developing RF pulses in tuned loads having, a full cycle pulse generator connected to a tuned load with, each full cycle generator comprising a pair of parallely connected symmetrical half-cycle SCR-triggered capacitor charging and discharging pulse generating circuits and each having its own separate equal voltage d.c. power supply. Each has a similar capacitor clamping circuit operable before discharging of the capacitor, for connecting the capacitor of each half-cycle generator of the full cycle pair of half-cycle generators through a diode to the d.c. power supply of the other half-cycle generator when the capacitor reverse voltage reaches the voltage level of its own d.c. power supply, thereby to cause power to flow therefrom to the other half-cycle generator power supply to clamp the reverse voltage thereto.

Preferred methodology and best mode designs and details are later explained.

DRAWINGS

The invention will now be described with reference to the accompanying drawings, FIG. 1 of which is a circuit diagram of a preferred cycle generator constructed in accordance with the present invention and operating without magnetic pulse compression; and, while more generally useful and applicable, particularly suited to the generation of Loran-C type transmissions;

PREFERRED EMBODIMENT(S) OF INVENTION

As before explained, the present invention employs successively triggered fill cycle generators, not half-cycle generators, connected in parallel and to a common tuned load, and a unique technique for clamping capacitor reverse voltages to prevent excessive voltage developing across the SCR thyristor switching elements. The invention also makes use of substantially lossless thyristor priming and recovery circuits and series regulation—and all with increased immunity to the deleterious effects of load shorts, such as may be caused by lightning strikes or the like.

Important advantages of using the cycle generators of the invention, as compared to half-cycle generators, reside in the lossless capacitor clamping circuits of the invention and the capability to use a common output transformer, as later detailed. In the prior half-cycle generators, a separate clamping power supply is required, as earlier stated, that results in losses of approximately 15% of the output power. In the cycle generator of the invention, on the other hand, the clamping losses are negligible. By using a common output transformer, moreover, the core volume of the transformer can be reduced by a factor of two, providing a substantial improvement in efficiency, also.

Figure 1:
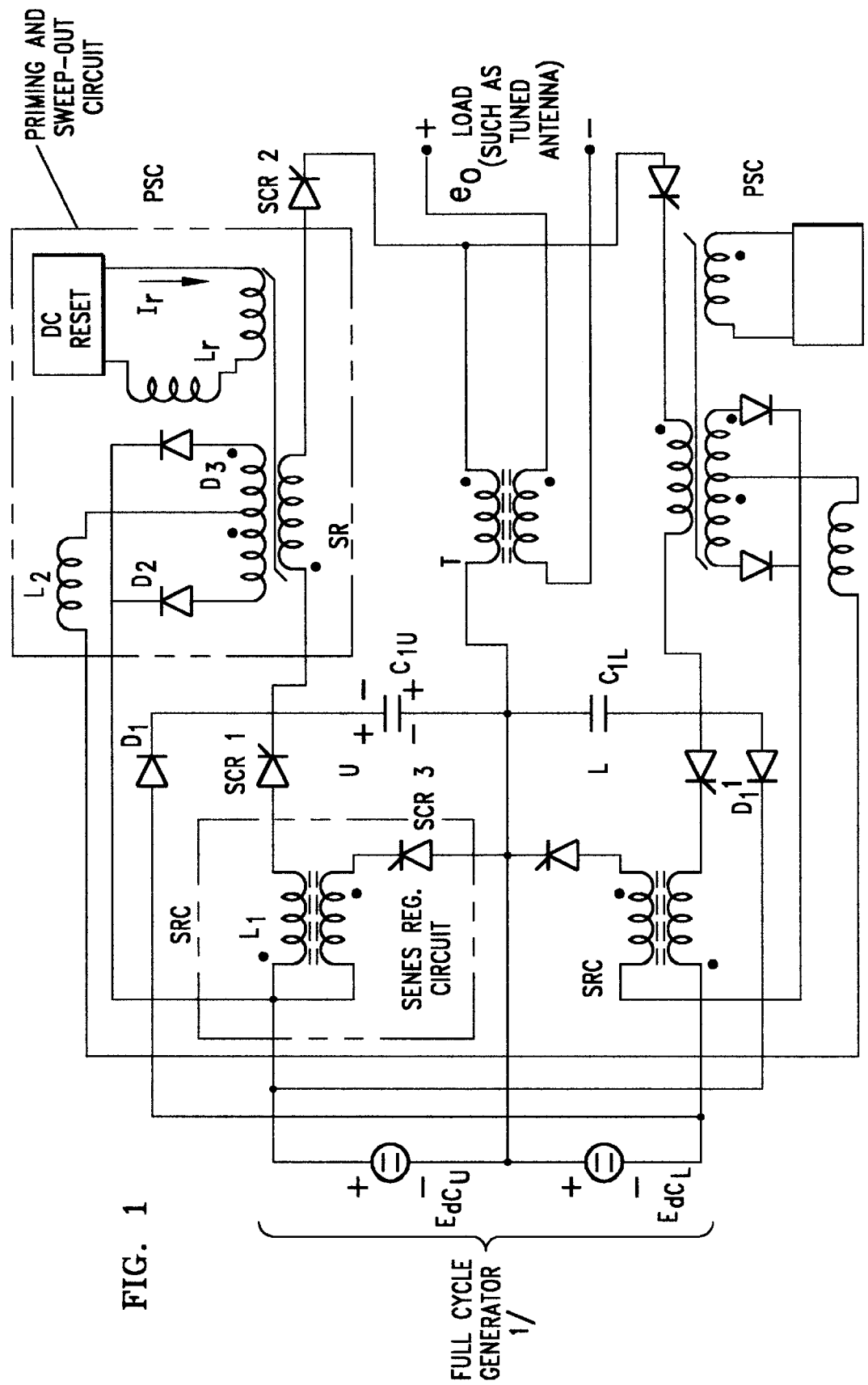

The operation of the cycle generator circuit of the invention will now be described in connection with circuit diagrams of FIGS. 1, 2 and 3. The cycle generator 1 consists of a pair of parallely connected symmetrical half-cycle generators, upper U and lower L, connected to the common output transformer T, in turn connected to a common load. Two separate dc power supplies $E_{dcU}$ and $E_{dcL}$ are used. This particular configuration is selected because it permits the use of these power supplies also as part of the novel clamping technique and circuits of the invention, as later explained.

A series regulator circuit (SRC), connected in series with the first switch $SCR_1$, is used to make sure that the amplitude of the illustrative RF Loran-C pulses within a group are the same. To minimize SCR losses, a priming and sweep-out circuit PSC is connected in series with the main power trigger thyristor $SCR_2$, with the operation of the circuit being as described in before-referenced U.S. Pat. Nos. 4,230,955 and 4,674,022. The basic function of the PSC, as before explained, is to delay the anode current until the full junction area is turned on, with the delaying means being a square loop saturable inductor SR, FIG. 1, and the delay being proportional to the voltage applied to the saturable inductor. The specification for the delay variation in a Loran-C transmitter, for example, is less than 10 nsec. For a priming time of 10 ,usec, this specification (10 nsec) results in the requirement that the voltage variation across the saturable inductor must be less than 0.1%.

The full-cycle generator is thus formed by the parallel connection of the symmetrical upper half-cycle circuit U and lower circuit L, each having respective equal separate power supplies $E_{dcU}$ and $E_{dcL}$, and comprising series regulating circuits SRC with series transformer $L_1$, and with its secondary connected by regulating switch $SCR_3$ across the power supply, series trigger switch $SCR_1$ and shunt charging capacitor $C_{1u}$, priming and sweep out circuit PSC and series main power switch $SCR_2$.

Precise voltage regulation is obtained by means of the series regulator circuit SRC and by the novel technique of clamping the reverse capacitor voltage of, for example, capacitor $C_{1u}$ of the upper circuit U, by means of a diode $D_1$ connected back to the power supply voltage $E_{dcL}$ of the lower circuit L. Since this is a negative voltage for the upper-half-cycle generator U, the negative power supply $E_{dcL}$ of the lower half-cycle generator L is used as the clamping source, and vice versa for the lower half-cycle generator L, which uses the upper positive power supply $E_{dcu}$ as the clamping source through diode $D_1^1$, for the lower capacitor $C_{1L}$.

Since both the series regulator circuits and the clamping circuits are almost lossless, this precise regulation is attained substantially without loss of power.

Figure 2:
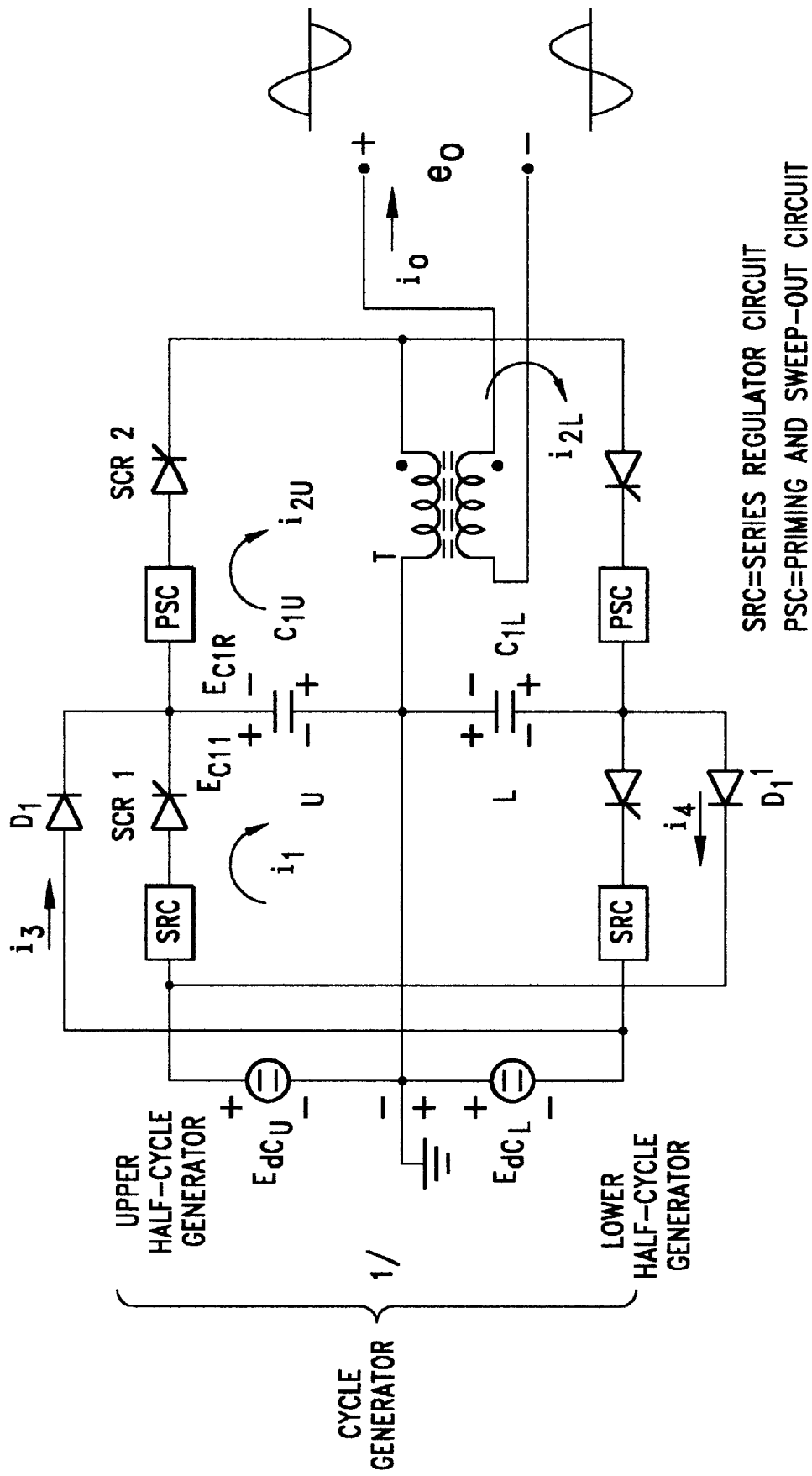
FIG. 2 is a simplified circuit diagram of the cycle generator of FIG. 1, showing operational waveforms achieved.
Figure 3:
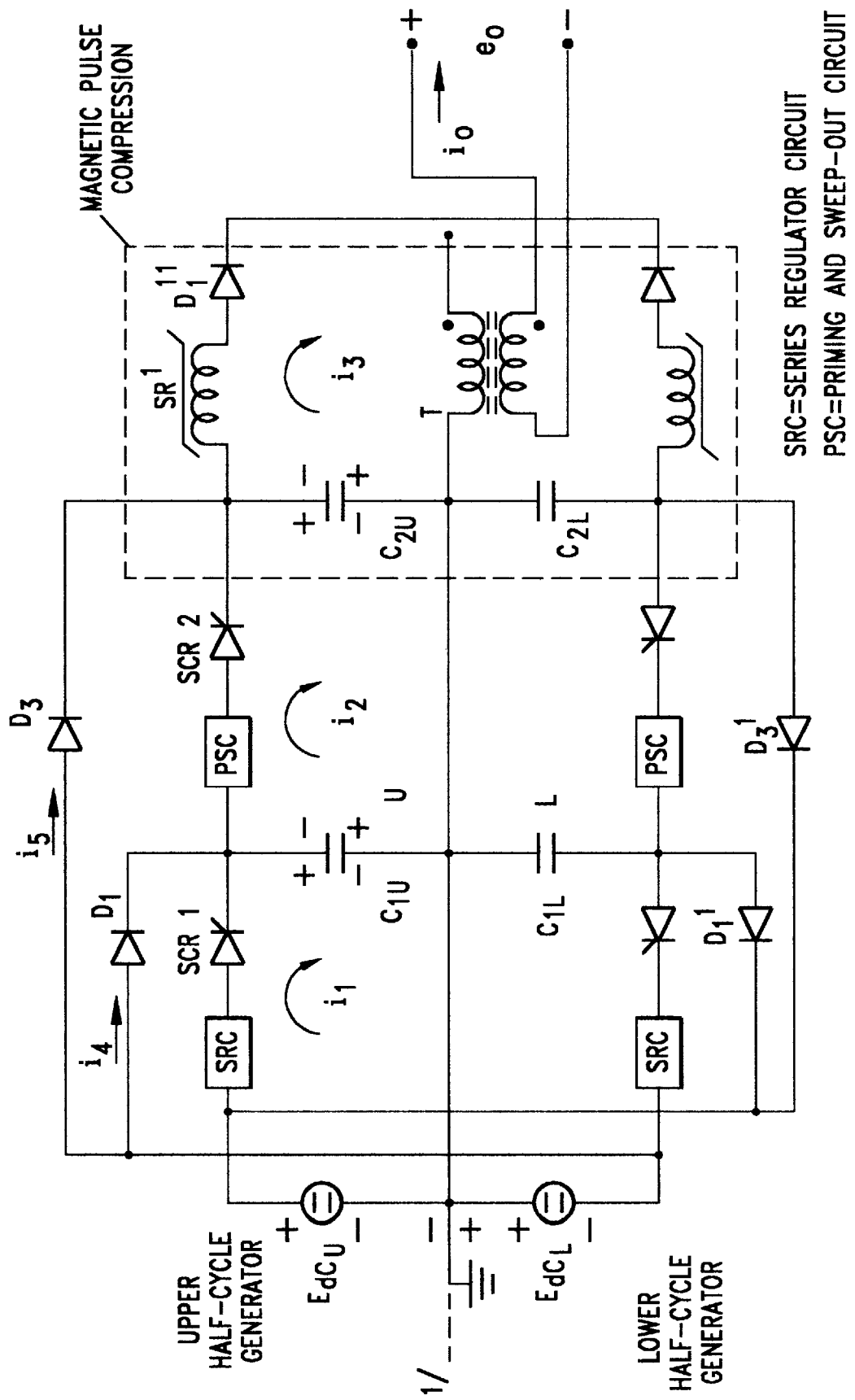
FIG. 3 is a circuit diagram of a cycle generator of the invention, similar to FIG. 2, but using magnetic pulse compression.

A magnetic pulse compression stage can be added, if desired, to the circuit of FIG. 2, as shown in FIG. 3. This additional stage consists of capacitor $C_{2U}$ ($C_{2L}$) saturable inductor $SR^1$, and diode $D_1^{11}$. To obtain the desired timing stability, the voltage on capacitor $C_{2U}$ ($C_{2L}$) must be controlled with the same accuracy as the voltage of capacitor $C_{1u}$ as above described. This voltage stability is obtained also by clamping the reverse voltage of capacitor $C_{2U}$ ($C_{2L}$) to the opposite power supply $E_{dcl}$ ($E_{dcU}$) by means of diode $D_3$ ($D_3^1$).

Figure 4:
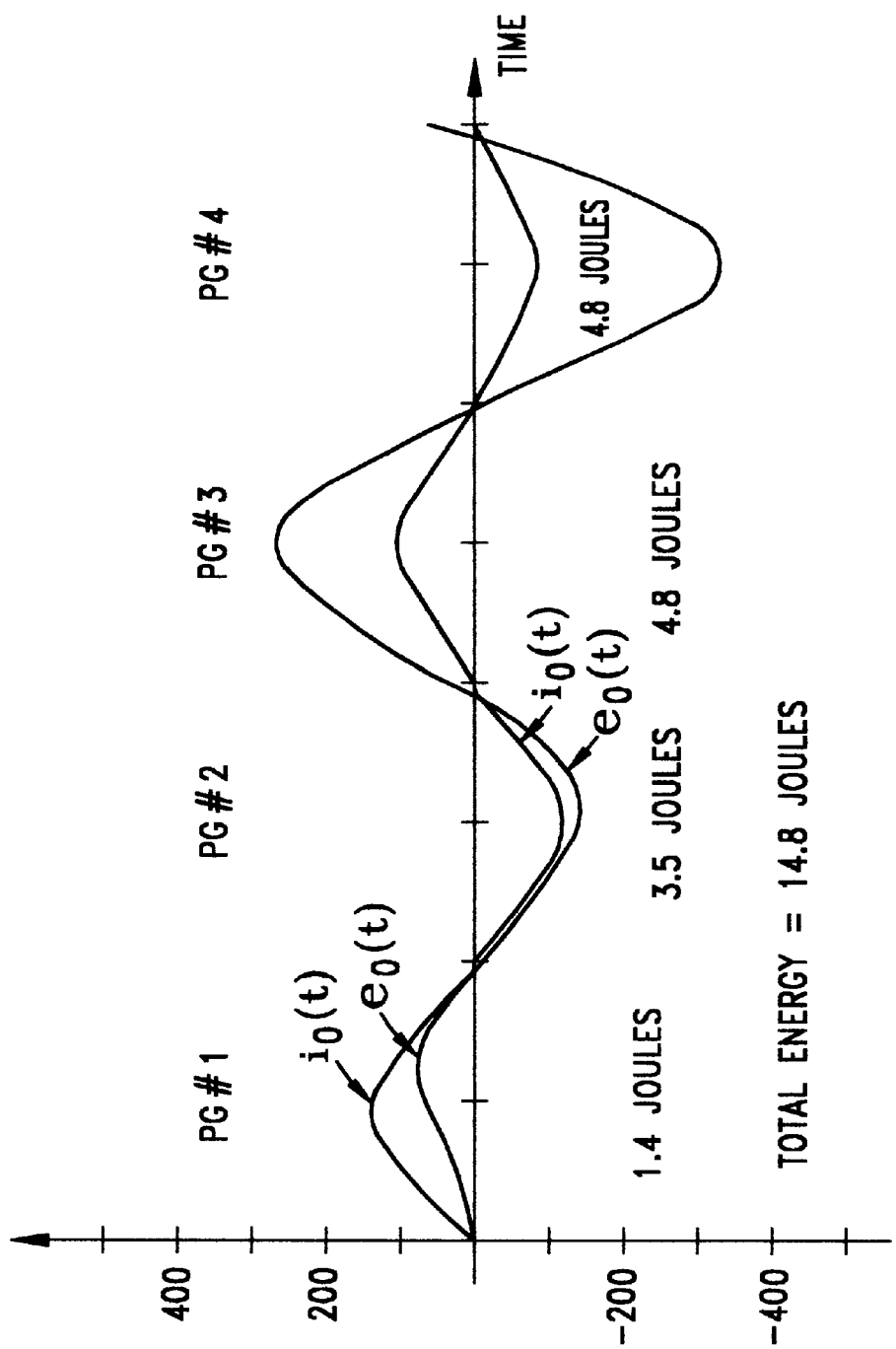
FIG. 4 is a graph presenting the typical voltage and current waveforms at the output of a Loran-C transmitter.

The variation in the reverse voltage on capacitor $C_{1u}$ (and $C_{2u}$) is caused by phase coding and dynamic 'impedance' variation of the load. Typical voltage and current waveforms at the output of a Loran-C transmitter are shown in FIG. 4. As seen from this figure, the output voltage amplitude $e_o$(t) at successive cycles increases with time; while the output current amplitude $i_o$(t) for successive cycles remains almost constant. Thus, the energy delivered to the load per half-cycle also increases with time. Considering an illustrative total energy of 14.8 joules operating in the circuit of FIG. 2, for example, the energy $u_1$ delivered to the load for half-cycle #1 is given by:

$$U1 = \frac{1}{2}C_1[(E_{c1}^+)^2 - (E_{c1}^-)^2]$$

assuming typical values of $C_1$=12 $\mu$F, and $E^+_c1$=825 volts, the value of $E_{c1}^-$ will be 670 volts.

For half cycle #2
$E^-_{c1}$=312 volts.

To resonantly charge $C_1$ to 825 volts, the dc power supply voltage must be grater than $$E_{DC} > \frac{825}{3} = 275 \text{ volts.}$$

If, therefore, $E_{DC}$ is set at 300 volts, the $C_1$ reverse voltage is clamped to 300 volts for both half-cycles. The large difference in the reverse voltage for the two half-cycles should, however, be noted; and, in the adherence of the technique of the invention, the series regulator is completely incapable of regulating this large voltage variation to the accuracy required.

As before stated, besides the requirement of very good voltage regulation, a Loran-C transmitter must also be able to work into a shorted load and be able to run reliably through thunderstorms. Direct lightning strikes on the antenna strikes on the antenna occur repeatedly and result in the generation of false triggers to the SCR's. The invention obviates any deleterious effects from such strikes as will now be shown.

Figure 5:
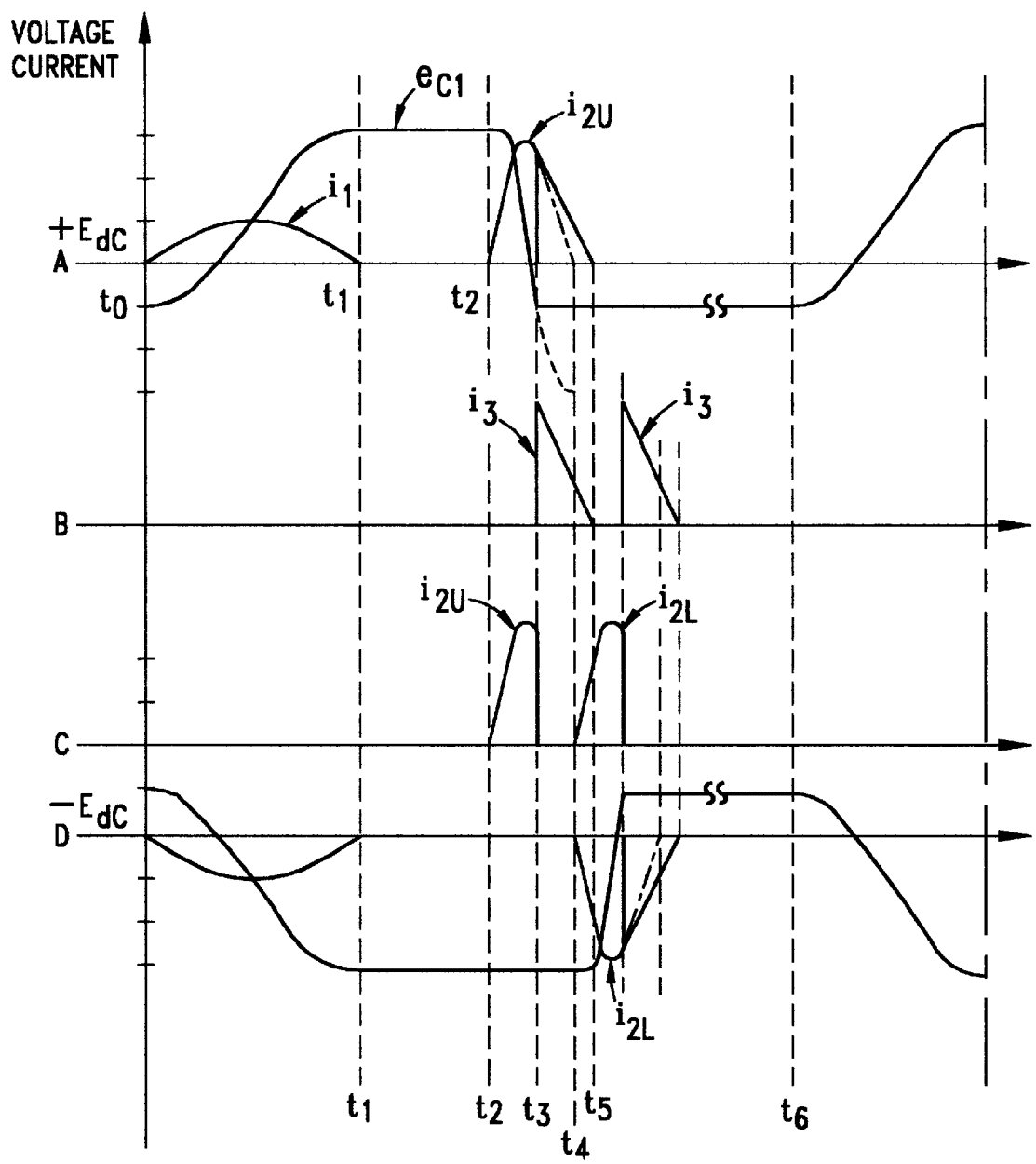
FIG. 5 presents the voltage and current waveforms illustrative of the operation of the circuits of the invention during shorting of the load, as by lightning striking the antenna.

Voltage and current waveforms for the cycle generator of FIG. 2, when the load is shorted, are shown in FIG. 5. At time $t_0$, the charging starts of capacitors C1u and C1$_L$ (upper and lower); and at time $t_1$, the charging is completed. To allow $SCR_1$ to recover, the discharge of capacitors C1u, and C1$_L$, is delayed to time $t_2$ for Cu and time $t_4$ for C1u. At time $t_2$ $SCR_2$ is turned on. Under short-circuit conditions, the capacitor voltage would completely reverse ($E^+_{CL}$.$\overline{E}^-_{CL}$), except for the action of the clamping diode $D_1$ of the invention. When the reverse voltage on $C^{1u}$ reaches the power supply voltage level, diode $D_1$ starts conducting, and the reverse voltage of capacitor $C_{1\mu}$ of the upper generator $\mu$ is clamped to the d.c. supply voltage EdcL of the lower generator L. In this way, power flows from the upper half-cycle generator dc power supply Edcu to the lower half-cycle generator dc power supply EdcL. When $SCR_2$ for the lower half-cycle generator L is turned on, power flows from the lower dc power supply EdcL to the upper dc power supply Edc$\mu$. Thus, the cycle generator easily handles a shorted load.

During a lightning strike, the cycle generator may experience simultaneous triggers to all SCR's. The worst that can happen under this condition with the circuit of the present invention is that the dc power supplies are dumped. To prevent SCR failures, the series regulator inductance $L_1$ of FIG. 1 is designed such that the current pulse during dumping is within the $I^2t$ rating of the SCR's. After dumping, the SCR's recover, dc power is reestablished, and normal SCR trigger signals are reapplied, thus restoring normal operation.

Further modifications will also occur to those skilled in the art, and such are considered to fall within the spirit and scope of the invention as described in the appended claims.

What is claimed is:

1. Pulse generator apparatus for developing RF pulses in tuned loads having, in combination, a full cycle pulse generator connected to a tuned load, the full cycle generator comprising a pair of parallely connected symmetrical half-cycle SCR-triggered capacitor charging and discharging pulse generators and each having its own separate capacitor and equal voltage d.c. power supply; and each having a similar capacitor clamping circuit operable before discharging of its capacitor, for connecting the capacitor of each half-cycle generator of the full cycle pair of half-cycle generators through a diode of the d.c. power supply of the other half-cycle generator when the capacitor reverse voltage reaches the voltage level of its own d.c. power supply, thereby to cause power to flow therefrom to the other half-cycle generator power supply to clamp the reverse voltage thereto, wherein each capacitor is connected to a common output transformer in turn connected to the load, and wherein a series regulator circuit is connected between the d.c. power supply and a first SCR trigger switch of each half-cycle generator of the full cycle generator, and wherein a priming and sweep out circuit is connected in series connection between the first SCR and a second main power SCR switch for delivering the capacitor voltage to the output transformer.

2. Apparatus as claimed in claim 1 wherein the series regulator circuit comprises a series-connected regulating inductance of value such that the current pulse generated in the event of dumping of the power supplies as a result of load shorting is within the $I^2t$ ratings of the SCR's.

3. Apparatus as claimed in claim 1 wherein a magnetic pulse compression circuit comprising a series reactor and a further capacitor is shunt connected between the main power SCR switch and the output transformer.

4. Apparatus as claimed in claim 3 wherein the series connection between said main power SCR and said magnetic pulse compression circuit of each half-cycle generator of the pair constituting a full cycle generator is provided with a similar capacitor clamping circuit connected through a diode to the d.c. power supply of the other half-cycle generator of the pair.

5. Apparatus as claimed in claim 1 wherein the tuned load is a tuned antenna, and the pulse generators are successively triggered to produce Loran-C transmission bursts in the antenna.

6. In a full cycle pulse generator comprised of a pair of parallely connected symmetrical half-cycle SCR triggered capacitor charging and discharging pulse generating circuits each having a separate capacitor and d.c. power supply, a method of clamping reverse voltage developed on the capacitor before discharging, that comprises, connecting said capacitor of each of the pair of half-cycle generating circuits during charging through a diode to the d.c. power supply of the other half-cycle generating circuits of the pair when the capacitor reverse voltage reaches the voltage level of its own d.c. power supply, thereby to cause power to flow therefrom to the other half-cycle generator power supply of the pair to effect clamping of the reverse voltage thereto, and in which the capacitor of each of the pair of generating circuits discharges into a common output transformer connected to energize a common tuned load, wherein series regulation is effected of the voltage between the d.c. power supply and a first SCR trigger switch of each half-cycle generator, and wherein electron priming and sweep out is effected in each half-cycle generator at a region in series between said first SCR and a second main power SCR switch controlling delivering the capacitor voltage to the common output transformer connected to the load.

7. A method as claimed in claim 6 wherein the pulse generating circuits are Loran-C pulse generators, and the load is a tuned antenna for transmitting Loran-C RF bursts generated in the tuned antenna in response to the pulses, and the priming and sweepout is effected with a delay of the order of less than $10\mu$ sec.

8. A method as claimed in claim 6 wherein the series regulation and clamping are effected substantially without power loss.

9. A method as claimed in claim 6 wherein magnetic pulse compression is effected in each generator of the pair between its main power SCR and the output transformer.

10. A method as claimed in claim 9 wherein capacitor clamping during magnetic compression is also effected in each generator of the pair by connecting its capacitor through a diode to the power supply of the other half-cycle generator of the pair.

* * * * *